(12) United States Patent
Anderl

(10) Patent No.: US 9,836,102 B1
(45) Date of Patent: Dec. 5, 2017

(54) ELECTRONIC COMPONENT COOLING SYSTEM

(71) Applicant: International Business Machines Corporation, Armonk, NY (US)

(72) Inventor: William J. Anderl, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/226,542

(22) Filed: Aug. 2, 2016

(51) Int. Cl.
G06F 1/20 (2006.01)
H05K 7/20 (2006.01)

(52) U.S. Cl.
CPC .............. *G06F 1/206* (2013.01); *G06F 1/203* (2013.01); *H05K 7/20727* (2013.01); *H05K 7/20736* (2013.01)

(58) Field of Classification Search
CPC ..... G06F 1/203; G06F 1/206; H05K 7/20727; H05K 7/20736
See application file for complete search history.

(56) References Cited

U.S. PATENT DOCUMENTS

| 5,477,416 | A | * | 12/1995 | Schkrohowsky | .. H05K 7/20563 |
| | | | | | 361/695 |
| 5,751,549 | A | * | 5/1998 | Eberhardt | .......... H05K 7/20718 |
| | | | | | 361/679.33 |
| 6,280,317 | B1 | | 8/2001 | Przilas et al. | |
| 6,483,699 | B1 | | 11/2002 | Salmonson et al. | |
| 6,621,700 | B1 | | 9/2003 | Roman et al. | |
| 6,853,552 | B2 | * | 2/2005 | Brewer | ...................... G06F 1/20 |
| | | | | | 248/634 |
| 6,862,182 | B1 | | 3/2005 | Roman et al. | |
| 6,896,612 | B1 | * | 5/2005 | Novotny | ............ H05K 7/20618 |
| | | | | | 361/691 |
| 7,345,873 | B2 | | 3/2008 | Dey et al. | |
| 2005/0168945 | A1 | * | 8/2005 | Coglitore | ........... H05K 7/20736 |
| | | | | | 361/695 |
| 2006/0234787 | A1 | * | 10/2006 | Lee | ....................... H05K 7/1412 |
| | | | | | 455/575.7 |
| 2009/0190301 | A1 | * | 7/2009 | Huang | ................ H05K 7/20736 |
| | | | | | 361/679.46 |
| 2010/0008025 | A1 | * | 1/2010 | Nemoz | .............. H05K 7/20563 |
| | | | | | 361/678 |

(Continued)

FOREIGN PATENT DOCUMENTS

| JP | 2012093773 | 5/2012 |
| JP | 5656262 B2 | 1/2015 |

*Primary Examiner* — Adrian S Wilson
(74) *Attorney, Agent, or Firm* — Patterson + Sheridan, LLP

(57) ABSTRACT

Embodiments herein describe a cooling system for a plurality of arrayed components arranged in a first bank and a second bank, the first bank being disposed upstream of the second bank along an airflow path. The system comprises a first wall configured to be positioned above the first bank and the second bank. The first wall defines an angled cavity such that a height of the angled cavity decreases from the front end of the angled cavity to a region between the front end and the back end of the angled cavity. The first wall defines the angled cavity such that a distance between the first wall and the first bank is greater than a distance between the first wall and the second bank. The first wall forms a top portion of the airflow path.

20 Claims, 9 Drawing Sheets

(56) References Cited

U.S. PATENT DOCUMENTS

2010/0097760 A1* 4/2010 Azar .................. H01L 23/4735
  361/695
2011/0081851 A1 4/2011 Franz et al.

* cited by examiner

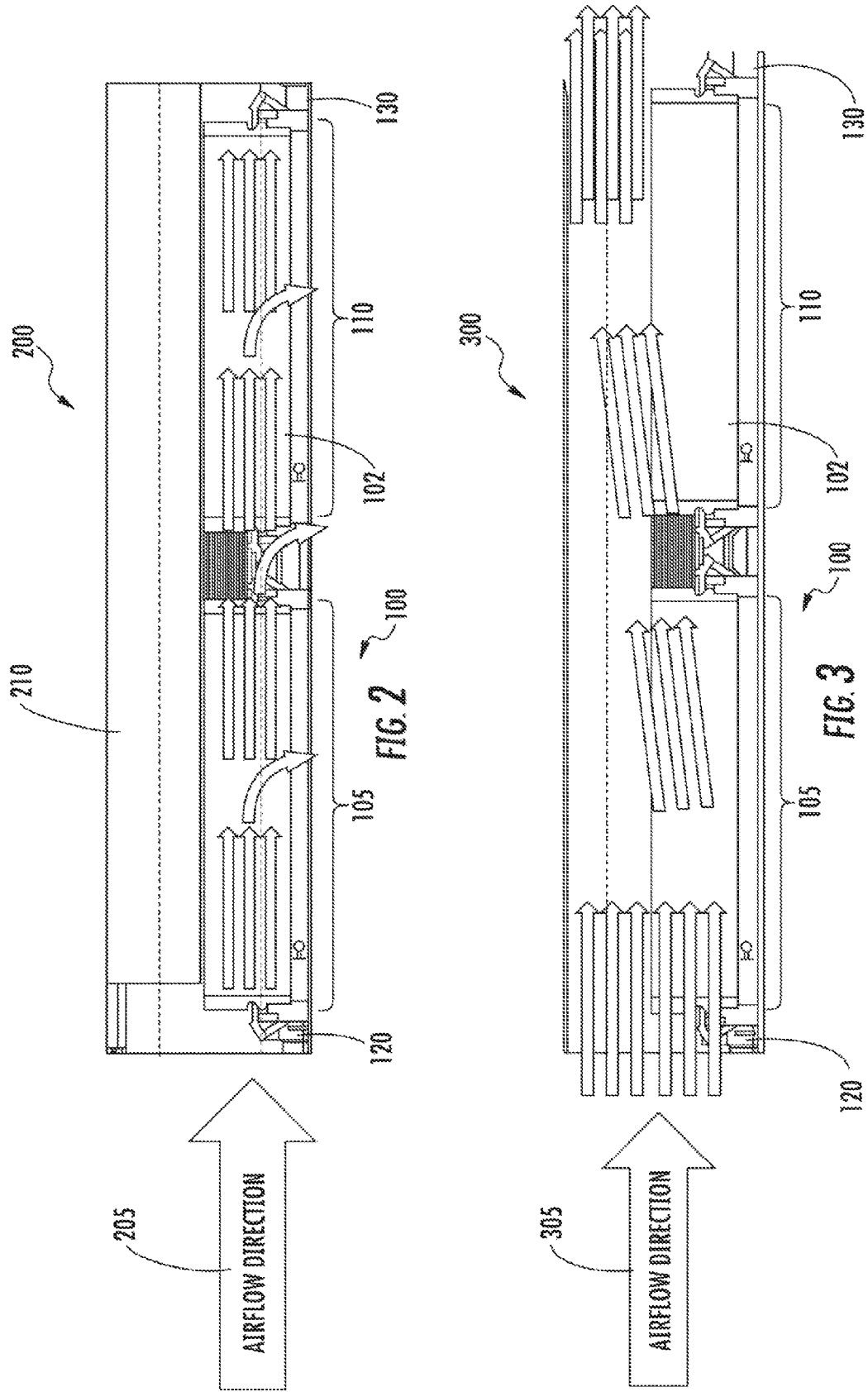

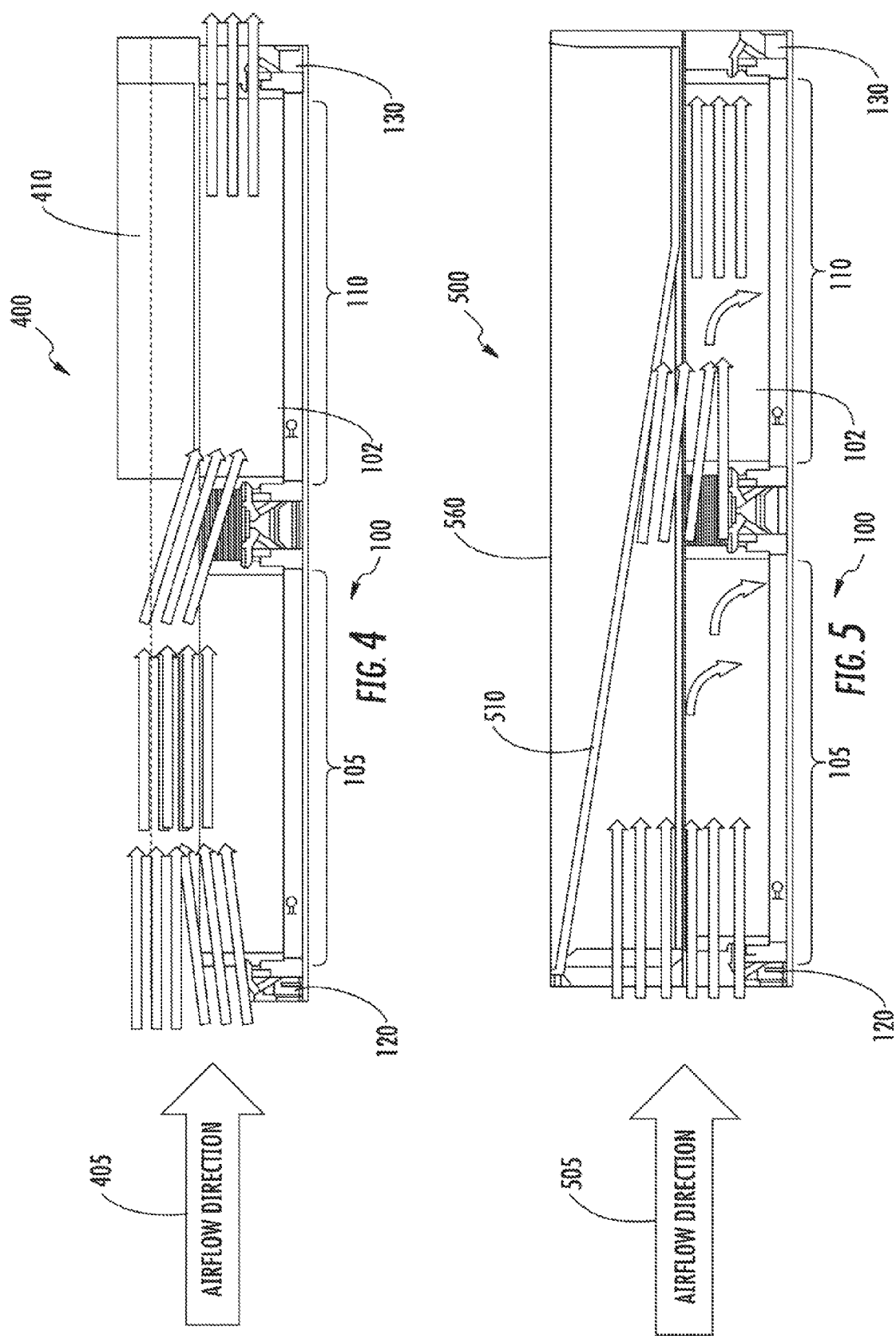

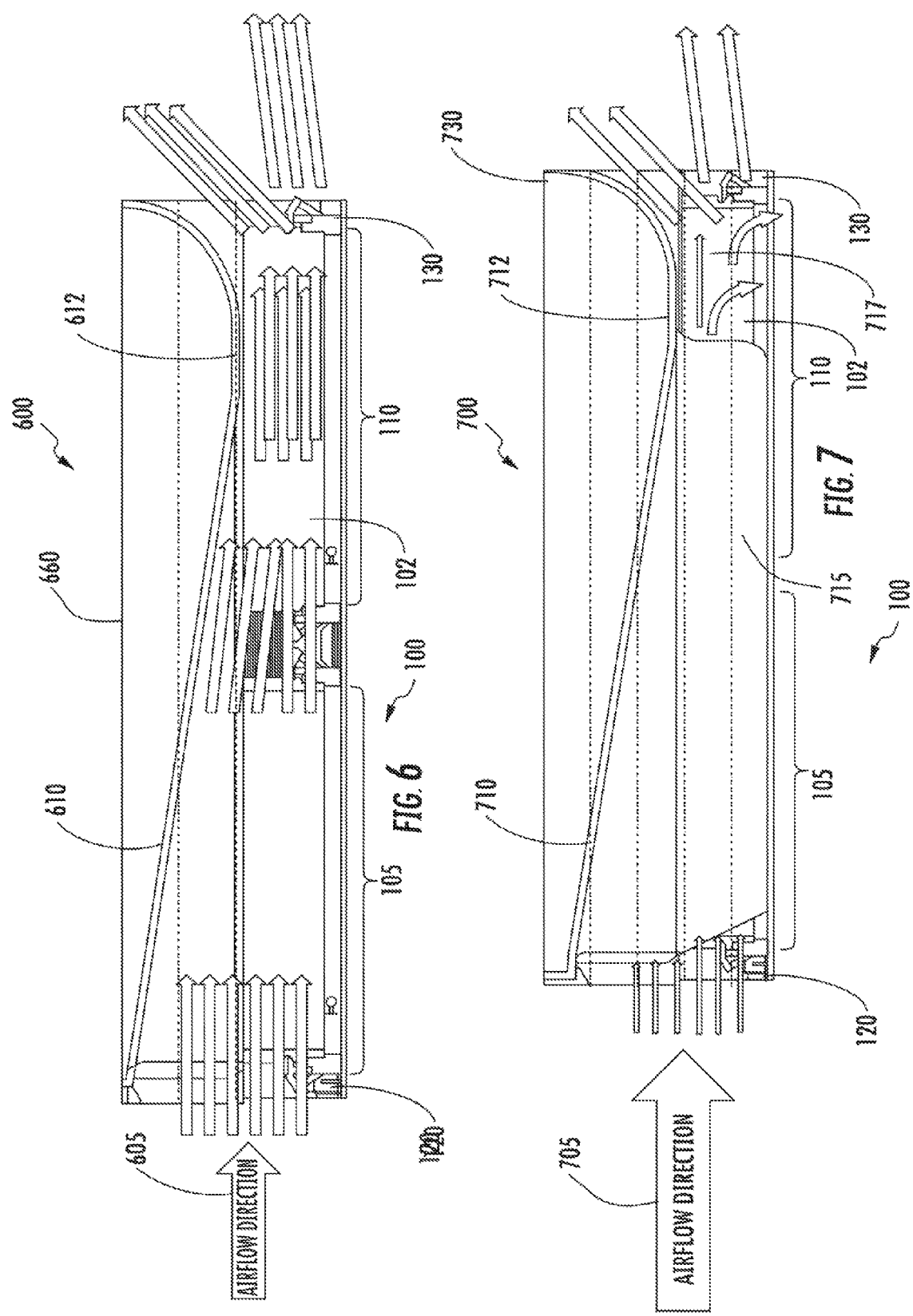

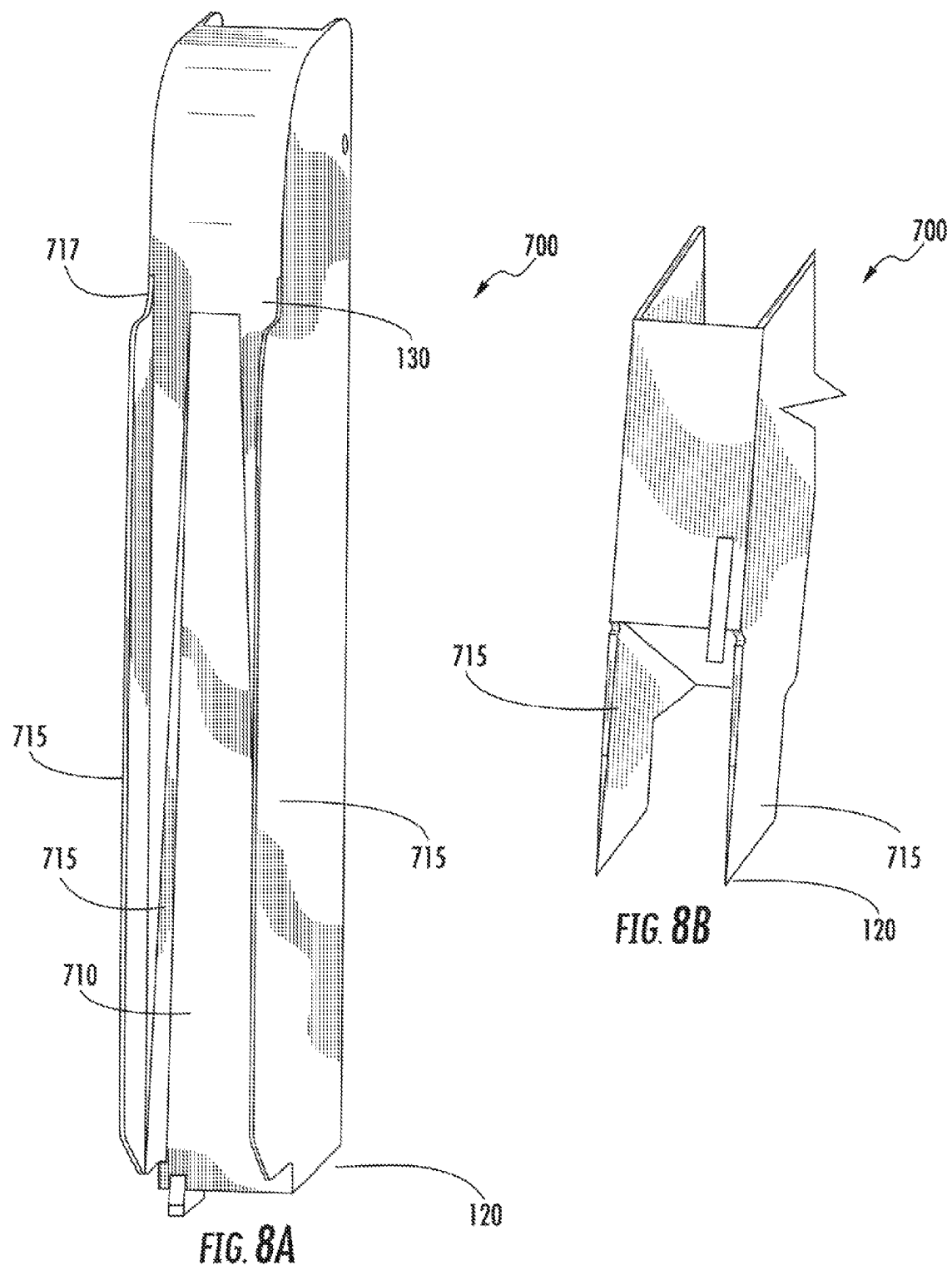

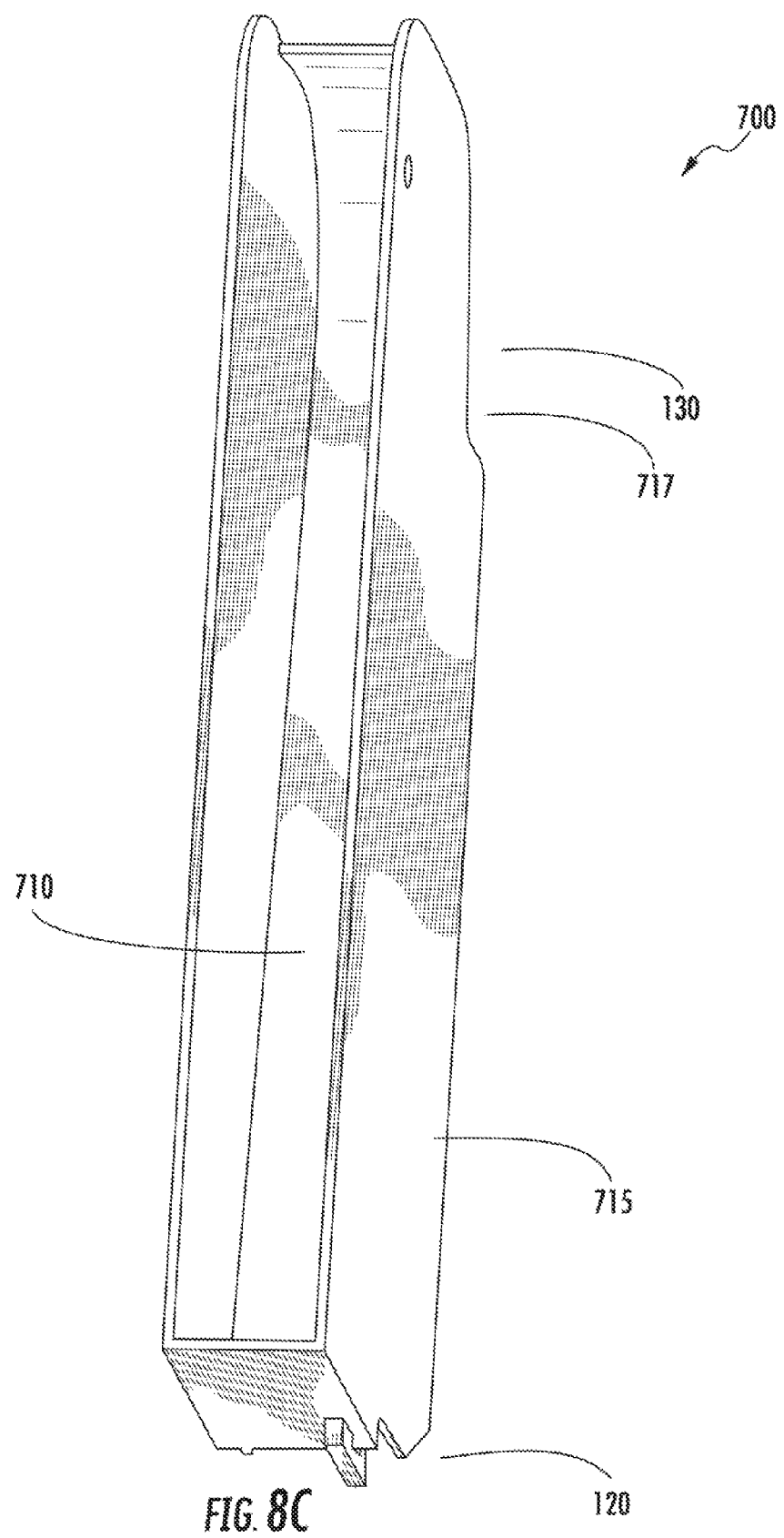

ously, the airflow over certain electronic components may include warmer air and/or less air, which may not effectively cool the electronic components.

ELECTRONIC COMPONENT COOLING SYSTEM

BACKGROUND

The present invention relates to cooling systems, and more specifically, to a cooling system, which uses airflow to cool electronic components.

Electronic components in devices consume power in order to function. The electronic components, when operating, may generate heat. Further, the functioning of such electronic components may degrade or fault when the electronic components are above certain operating temperature parameters. Therefore, active cooling of electronic components, such as memory modules (e.g., dual in-line memory modules (DIMMs)) in computing devices, may be used to ensure the electronic components stay within the operating temperature parameters.

Such cooling of electronic components may be performed using various techniques and systems, including heat exchangers, liquid cooling, air cooling, etc. Air cooling may be beneficial in certain circumstances as the components needed to provide airflow (e.g., a fan, blower, etc.) may be easier to maintain and cost less than components used for other cooling methods. However, merely moving air across electronic components may not be sufficient to cool the electronic components efficiently.

In particular, the electronic components may be arranged in an enclosure. The enclosure may limit the supply of air from outside the enclosure to inside the enclosure. Therefore, the air moved over some of the electronic components in the enclosure may be recycled air that has already been heated by other electronic components. For example, multiple electronic components in the enclosure may need to be cooled, and as the air moves across some of the components it may rise in temperature before reaching other components, or be impeded from reaching other components. Accordingly, the airflow over certain electronic components may include warmer air and/or less air, which may not effectively cool the electronic components.

SUMMARY

According to one embodiment described herein, a cooling system for a plurality of arrayed components, arranged in a first bank and a second bank, the first bank being disposed upstream of the second bank along an airflow path, includes a first wall configured to be positioned above the first bank and the second bank. The first wall defines an angled cavity such that a height for the angled cavity generally decreases from a front end to a back end of the angled cavity. The first wall defines the angled cavity such that a distance between the first wall and the first bank is greater than a distance between the first wall and the second bank. The system further includes a second wall configured to be positioned along a first side of the first bank and the second bank. The system further includes a third wall configured to be positioned along a second side of the first bank and the second bank opposite the first side. The first wall is positioned at an angle along a height of the second wall and the third wall. The second wall and the third wall define the angled cavity such that a width of the angled cavity generally decreases from the front end to the back end of the angled cavity. The angled cavity is configured to direct air toward the first bank and the second bank. The first wall forms a top portion of the airflow path, the second wall forms a first side portion of the airflow path, and the third wall forms a second side portion of the airflow path.

According to another embodiment described herein, a cooling system for a plurality of arrayed components arranged in a first bank and a second bank, the first bank being disposed upstream of the second bank along an airflow path includes a first wall configured to be positioned above the first bank and the second bank. The first wall defines an angled cavity such that a height of the angled cavity decreases from a front end of the angled cavity to a region between the front end and a back end of the angled cavity, and increases from the region to the back end of the angled cavity. The first wall defines the angled cavity such that a distance between the first wall and the first bank is greater than a distance between the first wall and the second bank. The first wall forms a top portion of the airflow path.

According to another embodiment described herein, a cooling system for a plurality of arrayed components arranged in a first bank and a second bank, the first bank being disposed upstream of the second bank along an airflow path includes a first wall configured to be positioned above the first bank and the second bank. The first wall defines an angled cavity such that a height of the angled cavity decreases from a front end of the angled cavity to a region between the front end and a back end of the angled cavity, and increases from the region to the back end of the angled cavity. The first wall defines the angled cavity such that a distance between the first wall and the first bank is greater than a distance between the first wall and the second bank. The cooling system further includes a second wall configured to be positioned along a first side of the first bank and the second bank. The cooling system further includes a third wall configured to be positioned along a second side of the first bank and the second bank opposite the first side. The first wall is positioned at an angle along a height of the second wall and the third wall. The second wall and the third wall define the angled cavity such that a width of the angled cavity generally decreases from the front end to the back end of the angled cavity. The angled cavity is configured to direct air toward the first bank and the second bank. The second wall comprises a first opening at a position on the second wall near the back end of the angled cavity. The third wall comprises a second opening at a position on the third wall near the back end of the angled cavity. The first wall forms a top portion of the airflow path, the second wall forms a first side portion of the airflow path, and the third wall forms a second side portion of the airflow path.

BRIEF DESCRIPTION OF THE SEVERAL VIEWS OF THE DRAWINGS

FIG. 2 is an illustration of a side view of an example cooling system for the memory system of FIG. 1, according to certain embodiments.

FIG. 3 is an illustration of a side view of an example cooling system for the memory system of FIG. 1, according to certain embodiments.

FIG. 4 is an illustration of a side view of an example cooling system for the memory system of FIG. 1, according to certain embodiments.

FIG. 5 is an illustration of a side view of an example cooling system for the memory system of FIG. 1, according to certain embodiments.

FIG. 6 is an illustration of a side view of an example cooling system for the memory system of FIG. 1, according to certain embodiments.

FIG. 7 is an illustration of a side view of an example cooling system for the memory system of FIG. 1, according to certain embodiments.

FIG. 8A is an illustration of a bottom view of an example cooling system for the memory system of FIG. 1, according to certain embodiments.

FIG. 8B is an illustration of a front view of an example cooling system for the memory system of FIG. 1, according to certain embodiments.

FIG. 8C is an illustration of a top view of an example cooling system for the memory system of FIG. 1, according to certain embodiments.

DETAILED DESCRIPTION

Embodiments herein describe a cooling system, which uses airflow to cool electronic components. In particular, the cooling system may be configured to cool a plurality of electronic components arranged along an airflow path of the cooling system. Certain embodiments are described herein with respect to cooling a plurality of memory modules (e.g., DIMMs) of a computing device. However, one of ordinary skill in the art will recognize that the techniques discussed herein may be applied to cooling of other components as well, such as a plurality of arrayed components arranged in sequential banks (e.g., a first bank and a second bank).

Figure 1:
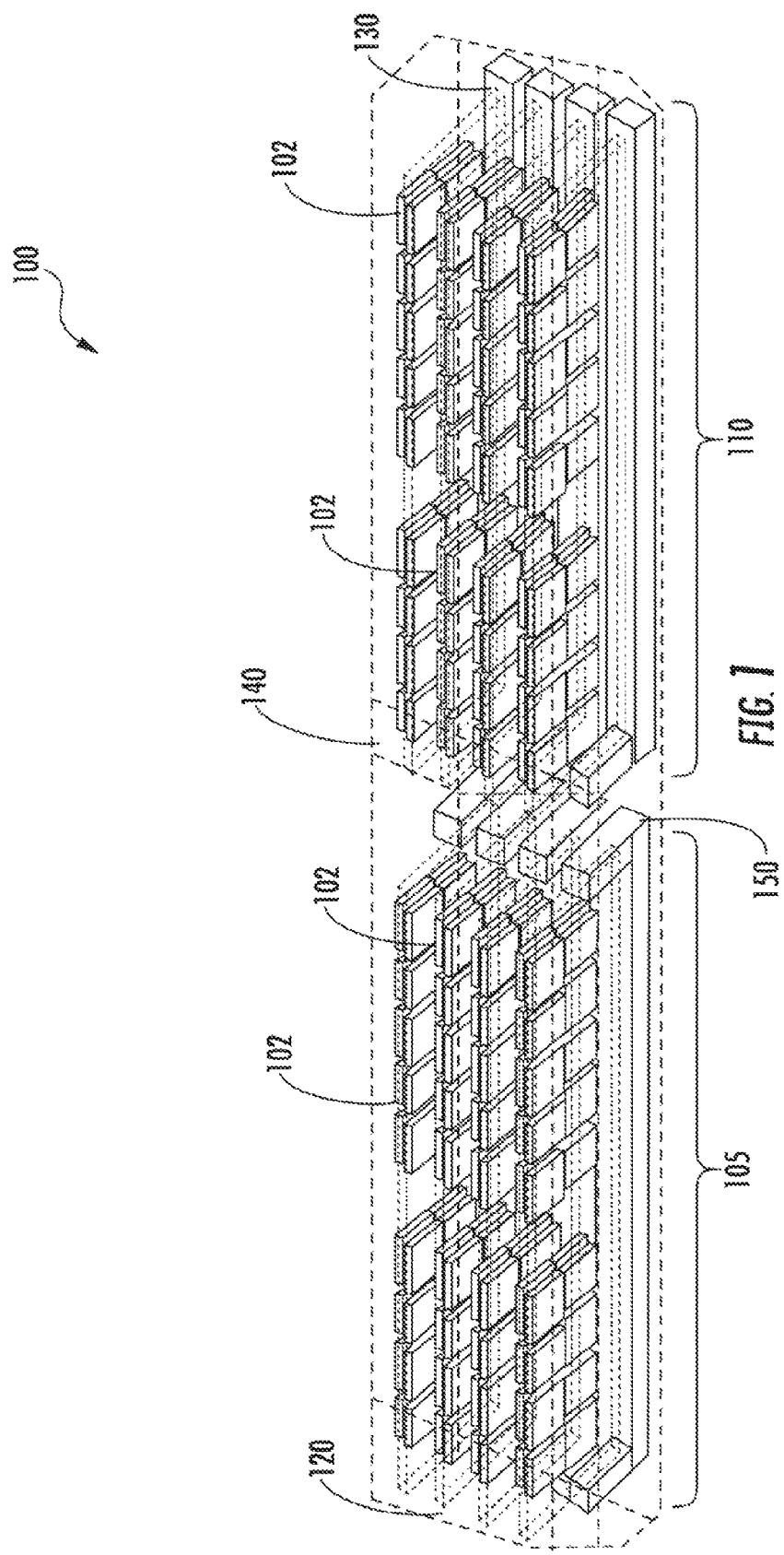
FIG. 1 is an illustration of an example of a memory system, according to certain embodiments.

FIG. 1 is an illustration of a memory system 100. The memory system 100 includes memory modules (e.g., DIMMs) 102 arranged into two banks, a first bank 105 and a second bank 110. In some embodiments, the memory system 100 may be located on a motherboard of a computing device (e.g., laptop, desktop, server, mobile device, etc.). The motherboard of the computing device and the memory system 100 may be enclosed along with other electronic components in an enclosure (e.g., case).

The first bank 105 may comprise any number of memory modules 102 arranged in parallel with each other (e.g., the first bank 105 may be of any suitable width). The second bank 110 may comprise any number of memory modules 102 arranged in parallel with each other (e.g., the second bank 110 may be of any suitable width). In certain embodiments, the number of memory modules 102 in the first bank 105 and the second bank 110 may be equal.

An airflow generator (e.g., one or more fans, blowers, etc.) may be configured to create a flow of air through the memory system 100 (e.g., in the enclosure where the memory system 100 is located). For example, the airflow generator may be configured to move air across the memory modules 102, where the path of the airflow moves from a front end 120 of the memory system 100 to a back end 130 of the memory system 100. In particular, the first bank 105 may be upstream of the second bank 110 along the airflow path created by the airflow generator. Further, air may also flow away from the first bank 105 and the second bank 110 to a first side 140 of the memory system 100, and a second side 150 of the memory system 100.

As air moves along the airflow path through the first bank 105, the air may increase in temperature as it moves heat being generated by the memory modules 102 of the first bank 105 away from the memory modules 102. The movement of heat away from the memory modules 102 of the first bank 105 may help cool the memory modules 102. However, as the air continues to move along the airflow path, the heated air is moved across the memory modules 102 of the second bank 110. Accordingly, the air used to cool the memory modules 102 of the second bank 110 may be heated air (e.g., as heated by the first bank 105) and may not be as effective at cooling the memory modules 102 of the second bank 110. Accordingly, the temperatures at the second bank 110 (e.g., the portion of the second bank 110 closest to the back end 130) may be higher than the temperatures at the first bank 105. Such uneven cooling may degrade the performance of the memory modules 102 of the second bank 110.

FIG. 2 is an illustration of a side view of a cooling system 200 for the memory system 100 which illustrates an environment in which uneven cooling may occur. As shown, the cooling system 200 includes an airflow generator 205, and an airflow impedance wall 210. As shown, the airflow impedance wall 210 may be positioned above the memory system 100 over both the first bank 105 and the second bank 110. The airflow impedance wall 210 is substantially parallel to the top of the memory system 100, with a face of the airflow impedance wall 210 facing the top of the memory system 100. Further, the distance between the airflow impedance wall 210 and the memory modules 102 of the first bank 105 and the second bank 110 is substantially uniform (e.g., equal).

In some embodiments, the airflow impedance wall 210 may be a single contiguous piece. In some embodiments, the airflow impedance wall 210 may be formed of separate pieces. Further, the airflow impedance wall 210 may extend across substantially the entire width of the memory system 100. In some embodiments, the airflow impedance wall 210 may extend beyond the width of the memory system 100.

The airflow impedance wall 210 may be configured to couple to or attach to (e.g., via attachment mechanisms, such as, clips screws, locking mechanisms, hinges, etc.) the memory system 100 or other areas in the enclosure with the memory system 100. In some embodiments, the airflow impedance wall 210 may be removably coupled to the memory system 100 or other areas in the enclosure with the memory system 100, meaning the airflow impedance wall 210 can be coupled using the coupling mechanism or fully detached. In some embodiments, the airflow impedance wall 210 may be movably coupled to the memory system 100 or other areas in the enclosure with the memory system 100, meaning the airflow impedance wall 210 may have one or more locations where the airflow impedance wall 210 is coupled and the airflow impedance wall 210 may move while still remaining coupled. For example, the airflow impedance wall 210 may be coupled to the memory system 100 or other areas in the enclosure with the memory system 100 via a hinge mechanism that allows the airflow impedance wall 210 to move with respect to the memory system 100 about the hinge.

The airflow impedance wall 210 may be configured to restrict air flow above the first bank 105 and the second bank 110. In particular, the airflow impedance wall 210 may prevent air from flowing up and away from the first bank 105 and second bank 110, and instead force the air to flow through the memory modules 102 of the first bank 105 and the second bank 110. Accordingly, the airflow impedance wall 210 may cause the airflow path to move through the first bank 105 and the second bank 110. Further, the first bank 105 may be upstream of the second bank 110. Accordingly, the air moving across the second bank 110 may be hotter than the air moving across the first bank 105. Thus, the second bank 110 may not be cooled effectively.

In the cooling system 200, to improve the cooling of the second bank 110, the airflow may need to be increased (e.g., fan speed increased), which may require more power and generate excess noise. Further, air may be lost through the sides 140 and 150 along the airflow path from the first bank 105 to the second bank 110, meaning that the airflow at the second bank 110 is decreased as compared to the airflow across the first bank 105, further reducing the effectiveness of the cooling of the second bank 110.

FIG. 3 is an illustration of a side view of a cooling system 300 for the memory system 100. As shown, the cooling system 300 includes an airflow generator 305. Unlike the cooling system 200, the cooling system 300 does not include an airflow impedance wall over the memory system 100. Accordingly, the airflow path generated by the airflow generator 305 may not be restricted from moving up and away from the memory system 100. The overall airflow of the cooling system 300 may be increased as compared to the cooling system 200, since the airflow path is not restricted. However, as air flows through the memory modules 102 of the first bank 105, the airflow impedance (which may be caused by constricted airflow between the space between the memory modules 102) between the adjacent parallel memory modules 102 may cause the air to flow up and away from the first bank 105 and the second bank 110, as shown by the arrows representing the airflow path. Accordingly, the second bank 110 may receive decreased or little airflow relative to the system 200, reducing the effectiveness of the cooling of the second bank 110.

FIG. 4 is an illustration of a side view of a cooling system 400 for the memory system 100. As shown, the cooling system 400 includes an airflow generator 405. Further, similar to the cooling system 200, the cooling system 400 includes an airflow impedance wall 410. However, unlike the airflow impedance wall 210, the airflow impedance wall 410 is positioned above only the second bank 110 and not the first bank 105. The airflow impedance wall 410 is substantially parallel to the top of the second bank 110, with a face of the airflow impedance wall 410 facing the top of the memory system 100. Further, the distance between the airflow impedance wall 410 and the memory modules 102 of the second bank 110 is substantially uniform (e.g., equal).

In some embodiments, the airflow impedance wall 410 may be a single contiguous piece. In some embodiments, the airflow impedance wall 410 may be formed of separate pieces. Further, the airflow impedance wall 410 may extend across substantially the entire width of the second bank 110. In some embodiments, the airflow impedance wall 410 may extend beyond the width of the second bank 110.

The airflow impedance wall 410 may be configured to couple to or attach to (e.g., via attachment mechanisms, such as, clips screws, locking mechanisms, hinges, etc.) the memory system 100 or other areas in the enclosure with the memory system 100. In some embodiments, the airflow impedance wall 410 may be removably coupled to the memory system 100 or other areas in the enclosure with the memory system 100, meaning the airflow impedance wall 410 can be coupled using the coupling mechanism or fully detached. In some embodiments, the airflow impedance wall 410 may be movably coupled to the memory system 100 or other areas in the enclosure with the memory system 100, meaning the airflow impedance wall 410 may have one or more locations where the airflow impedance wall 410 is coupled and the airflow impedance wall 410 may move while still remaining coupled. For example, the airflow impedance wall 410 may be coupled to the memory system 100 or other areas in the enclosure with the memory system 100 via a hinge mechanism that allows the airflow impedance wall 410 to move with respect to the memory system 100 about the hinge.

The airflow impedance wall 410 may be configured to restrict air flow above the second bank 110. In particular, the airflow impedance wall 410 may prevent air from flowing up and away from the second bank 110, and instead force the air to flow through the memory modules 102 of the second bank 110. However, the airflow impedance wall 410 may increase an airflow impedance through the second bank 110. Accordingly, the airflow impedance may be increased along the bottom of the memory system 100, including at the first bank 105. Therefore, the air impedance may hinder air from entering the first bank 105 and instead the airflow path may be pushed above the first bank 105, and then back down through the second bank 110 as shown. Thus, in the cooling system 400, the second bank 110 may be effectively cooled, but the decreased airflow across the first bank 105 may result in ineffective cooling of the first bank 105.

Accordingly, the various embodiments described with respect to cooling system 200-400 may not effectively cool multiple electronic components such as the memory modules 102 of the memory system 100. Certain embodiments described herein may relate to cooling system designs that effectively cool multiple electronic components such as the memory modules 102 of the memory system 100.

FIG. 5 is an illustration of a side view of a cooling system 500 for the memory system 100, according to one embodiment. As shown, the cooling system 500 includes an airflow generator 505, and an airflow impedance wall 510. As shown, the airflow impedance wall 510 may be positioned above the memory system 100 over both the first bank 105 and the second bank 110, with a face of the airflow impedance wall 510 facing the top of the memory system 100. Unlike the airflow impedance walls 210 and 410, the airflow impedance wall 510 is positioned at an angle with respect to the top of the memory system 100. The angle may be, for example, less than 45 degrees. In particular, the airflow impedance wall 510 may be configured to taper toward the memory system 100 from the front end 120 to the back end 130. Accordingly, the distance between the airflow impedance wall 510 and the first bank 105 is generally greater than a distance between the airflow impedance wall 510 and the second bank 110. Therefore, the distance between the airflow impedance wall 510 and the memory system 100 may be generally decreasing from the front end 120 to the back end 130. In some embodiments, the airflow impedance wall 510 may taper substantially all the way from the front end 120 to the back end 130. In some embodiments, the airflow impedance wall may taper from the front end 120 to some region along the second bank 110 (e.g., halfway along the second bank 110) and then continue in parallel with the second bank 110. Accordingly, the airflow impedance wall 510 may define an angled cavity for air flow above the memory system 100. Further, a height of the angled cavity may decrease from a front end of the angled cavity to a back end of the angled cavity (e.g., from the first bank 105 to the second bank 110). The decrease in height of the angled cavity may gradually increase airflow impedance starting from the front end 120 to the back end 130.

In some embodiments, the airflow impedance wall 510 may have a substantially flat surface. In some embodiments, the airflow impedance wall 510 may be contiguous with no breaks in the wall for air to flow through. In some embodiments, the airflow impedance wall 510 may have a curve. In some embodiments, the airflow impedance wall 510 may be a single contiguous piece. In some embodiments, the airflow impedance wall 510 may be formed of separate pieces. Further, the airflow impedance wall 510 may extend across substantially the entire width of the memory system 100. In some embodiments, the airflow impedance wall 510 may extend beyond the width of the memory system 100.

The airflow impedance wall 510 may be configured to couple to or attach to (e.g., via attachment mechanisms, such as, clips screws, locking mechanisms, hinges, etc.) the memory system 100 or other areas in the enclosure with the memory system 100. For example, the airflow impedance wall 510 may comprise attachment mechanisms to attach to a surface 560 above the memory system 100. The face of the airflow impedance wall 510 facing the memory system 100 may be opposite to and at an angle to the surface 560 above the memory system 100 from a front end of the airflow impedance wall 510 to a back end of the airflow impedance wall 510. In some embodiments, the airflow impedance wall 510 may be removably coupled to the memory system 100 or other areas in the enclosure with the memory system 100, meaning the airflow impedance wall 510 can be coupled using the coupling mechanism or fully detached. In some embodiments, the airflow impedance wall 510 may be movably coupled to the memory system 100 or other areas in the enclosure with the memory system 100, meaning the airflow impedance wall 510 may have one or more locations where the airflow impedance wall 510 is coupled and the airflow impedance wall 510 may move while still remaining coupled. For example, the airflow impedance wall 510 may be coupled to the memory system 100 or other areas in the enclosure with the memory system 100 via a hinge mechanism that allows the airflow impedance wall 510 to move with respect to the memory system 100 about the hinge.

The airflow impedance wall 510 may be configured to move air through both the first bank 105 and the second bank 110, as can be seen by the arrows. In particular, the airflow impedance wall 510 gradually increases airflow impedance starting from the front end 120 to the back end 130. This is unlike the airflow impedance wall 410, which abruptly increases airflow impedance at the second bank 110, and therefore causes air to flow above the first bank 105 instead of through the first bank 105. The airflow impedance wall 510 may thus define an airflow path with increasing airflow impedance from the front end 120 to the back end 130. In particular, the airflow impedance wall 510 may form a top portion of the airflow path that moves air from above the first bank 105 and the second bank 110, toward the first bank 105 and the second bank 110.

Further, as can be seen by the arrows, some of the airflow to the second bank 110 comes from air that has not flowed through the first bank 105 (e.g., from above the first bank 105). Accordingly, the air flowing through the second bank 110 may not all be air heated through the first bank 105, and may be cooler than the air flowing in cooling system 200. Therefore, the cooling system 500 may provide more effective cooling for the first bank 105 and the second bank 110, as compared to the cooling system 200.

FIG. 6 is an illustration of a side view of a cooling system 600 for the memory system 100. As shown, the cooling system 600 includes an airflow generator 605, and an airflow impedance wall 610. As shown, the airflow impedance wall 610 may be positioned above the memory system 100 over both the first bank 105 and the second bank 110, with a face of the airflow impedance wall 610 facing the top of the memory system 100. Similar to the airflow impedance wall 510, the airflow impedance wall 610 is positioned at an angle (e.g., a substantially constant angle or curve) with respect to the top of the memory system 100. In particular, the airflow impedance wall 610 may be configured to generally taper toward the memory system 100 from the front end 120 to the back end 130. Accordingly, the distance between the airflow impedance wall 610 and the first bank 105 is generally greater than a distance between the airflow impedance wall 610 and the second bank 110. Therefore, the distance between the airflow impedance wall 610 and the memory system 100 may be generally decreasing from the front end 120 to the back end 130.

However, the airflow impedance wall 610 differs from the airflow impedance wall 510 in that the airflow impedance wall 610 includes a portion that tapers away from the second bank 110. In particular, the airflow impedance wall 610 generally tapers toward the memory system 100 from the front end 120 to the back end 130 up to a region 612 near the second bank 110 (e.g., middle of the second bank 110, between the middle of the second bank 110 and the back end 130, etc.). Further, starting at the region 612 and toward the back end 130, the airflow impedance wall 610 tapers away from the memory system 100. The airflow impedance wall 610 may taper/slope away as a curve, at an angle, etc. Accordingly, the distance between the airflow impedance 610 wall and the second bank 110 may be increasing. Thus, the airflow impedance wall 610 may have a substantially triangle-like shape from the side view of the airflow impedance wall 610. Accordingly, the airflow impedance wall 510 may define an angled cavity for air flow above the memory system 100. Further, a height of the angled cavity may decrease from a front end of the angled cavity (e.g., front 120) to the region 612 and increase from the region 612 to a back end of the angled cavity (e.g., back 130).

In some embodiments, the airflow impedance wall 610 may be a single contiguous piece. In some embodiments, the airflow impedance wall 610 may be formed of separate pieces. Further, the airflow impedance wall 610 may extend across substantially the entire width of the memory system 100. In some embodiments, the airflow impedance wall 610 may extend beyond the width of the memory system 100.

The airflow impedance wall 610 may be configured to couple to or attach to (e.g., via attachment mechanisms, such as, clips screws, locking mechanisms, hinges, etc.) the memory system 100 or other areas in the enclosure with the memory system 100. For example, the airflow impedance wall 610 may comprise attachment mechanisms to attach to a surface 660 above the memory system 100. The face of the airflow impedance wall 610 facing the memory system 100 may be opposite to and at an angle to surface 660 above the memory system 100. For example the face of the impedance wall 610 may be at a first angle and generally taper away from the surface 660 above the memory system 100 from a first end of the impedance wall 610 until a region 612 on the impedance wall 610 near the second bank 110. The face of the impedance wall 610 may be at a second angle and generally taper toward the surface 660 above the memory system 100 from the region 612 on the impedance wall 610 to a back end of the impedance wall 610. In some embodiments, the airflow impedance wall 610 may be removably coupled to the memory system 100 or other areas in the enclosure with the memory system 100, meaning the airflow impedance wall 610 can be coupled using the coupling mechanism or fully detached. In some embodiments, the airflow impedance wall 610 may be movably coupled to the memory system 100 or other areas in the enclosure with the memory system 100, meaning the airflow impedance wall 610 may have one or more locations where the airflow impedance wall 610 is coupled and the airflow impedance wall 610 may move while still remaining coupled. For example, the airflow impedance wall 610 may be coupled to the memory system 100 or other areas in the enclosure with the memory system 100 via a hinge mechanism that allows the airflow impedance wall 610 to move with respect to the memory system 100 about the hinge.

The tapering away of the airflow impedance wall 610 from the memory system 100 at the second bank 110 near the back end 130 may decrease the pressure impedance through the second bank 110 and the first bank 105 by allowing greater airflow at the portion of the second bank 110 near the back end 130. This may improve airflow through both the first bank 105 and the second bank 110. Accordingly, the airflow impedance wall 610 may be configured to move air through both the first bank 105 and the second bank 110, as can be seen by the arrows. In particular, the airflow impedance wall 610 gradually increases airflow impedance starting from the front end 120 to the back end 130 and then decreases airflow impedance near the back end 130. The airflow impedance wall 610 may thus define an airflow path with increasing airflow impedance from the front end 120 to the back end 130 up to the region on the second bank 110, and decreasing airflow impedance from the region on the second bank 110 to the back end 130. In particular, the airflow impedance wall 610 may form a top portion of the airflow path that moves air from above the first bank 105 and the second bank 110, toward the first bank 105 and the second bank 110.

Further, as can be seen by the arrows, some of the airflow to the second bank 110 comes from air that has not gone through the first bank 105 (e.g., from above the first bank 105). Accordingly, the air flowing through the second bank 110 may not all be air heated through the first bank 105, and may be cooler than the air flowing in cooling system 200. Therefore, the cooling system 600 may provide more effective cooling for the first bank 105 and the second bank 110.

FIG. 7 is an illustration of a side view of a cooling system 700 for the memory system 100. As shown, the cooling system 700 includes an airflow generator 705, and an airflow impedance wall 710 similar to the airflow impedance wall 610 as described with respect to FIG. 6. In some embodiments, the cooling system 700 may include an airflow impedance wall 710 similar to the airflow impedance wall 510 as described with respect to FIG. 5, instead of the airflow impedance wall 610.

In addition, as shown the cooling system 700 includes airflow impedance side walls 715. The airflow impedance side walls 715 may be positioned at sides 140 and 150 of the memory system 100. Accordingly, the airflow impedance side walls 715 may be positioned along the sides of the first bank 105 and the second bank 110. A face of each of the airflow impedance side walls 715 may face the first bank 105 and the second bank 110, and each other. Further, the airflow impedance side walls 715 may extend across substantially the entire height of the memory system 100. The airflow impedance wall 710 may be positioned at an angle along the height of the airflow impedance side walls 715. For example, the airflow impedance wall 710 may be positioned at an angle such that the airflow impedance wall 710 gradually tapers along the height of the airflow impedance side walls 715. Accordingly, the airflow impedance wall 710 and airflow impedance side walls 715 define an angled cavity above the memory system 100.

The airflow impedance side walls 715 may restrict airflow to the sides 140 and 150 of the first bank 105 and the second bank 110. Accordingly, as air flows through the first bank 105, the air is restricted from moving to the sides 140 and 150 of the first bank 105. Thus, the air continues to the second bank 110 and the airflow across the second bank 110 is increased as compared to cooling systems 200-600. The airflow impedance side walls 715 therefore define an airflow path through the first bank 105 and the second bank 110 with increased airflow impedance toward the airflow impedance side walls 715. In particular, the airflow impedance side walls 715 may form side portions of the airflow path that move air from the sides of the first bank 105 and the second bank 110, toward the middle of the first bank 105 and the second bank 110.

In some embodiments, as shown, the airflow impedance side walls 715 include openings or cutouts 717 in each of the airflow impedance side walls 715. It should be noted that in some embodiments, the airflow impedance side walls 715 do not include openings 717. The openings 717 are shown having a generally rectangular shape, but may have any suitable shape. The openings 717 are located near a back end of the airflow impedance side walls 715. In some embodiments, the openings 717 may start at a region 712 of the airflow impedance side walls near the second bank 110 (e.g., middle of the second bank 110, between the middle of the second bank 110 and the back end 130, etc.) and extend to the back end of the airflow impedance side walls 715. In some embodiments, where the airflow impedance wall 710 comprises an airflow impedance sidewall similar to the airflow impedance side wall 610, the openings 717 may start at the same region as the upward taper of the airflow impedance wall 710.

The openings 717 in the airflow impedance side walls 715 may decrease the pressure impedance through the second bank 110 and the first bank 105 by allowing greater airflow at the portion of the second bank 110 near the back end 130. This may improve airflow through both the first bank 105 and the second bank 110. Accordingly, the airflow impedance side walls 715 may be configured to move air through both the first bank 105 and the second bank 110, as can be seen by the arrows. Further, the openings 717 may create space for the air warmed at the first bank 105 to escape.

In some embodiments, each of the airflow impedance side walls 715 may be a single contiguous piece. In some embodiments, each of the airflow impedance side walls 715 may be formed of separate pieces. In some embodiments, one or more the airflow impedance side walls 715 may be configured to couple to or attach to (e.g., via attachment mechanisms, such as, clips screws, locking mechanisms, hinges, etc.) the memory system 100 or other areas in the enclosure with the memory system 100. For example, the airflow impedance side walls 715 may comprise attachment mechanisms that attach to the sides 140 and 150 of the memory system 100, or to surfaces near the sides 140 and 150 of the memory system 100.

In some embodiments, the airflow impedance side walls 715 and the airflow impedance wall 710 may be formed as a single contiguous piece. In such embodiments, attachment mechanisms for attaching the piece including the airflow impedance side walls 715 and the airflow impedance wall 710 may be included on one or more of the airflow impedance side walls 715 and/or the airflow impedance wall 710.

In some embodiments, the airflow impedance wall 710 may be removably coupled to the memory system 100 or other areas in the enclosure with the memory system 100, meaning the airflow impedance wall 710 can be coupled using the coupling mechanism or fully detached. In some embodiments, the airflow impedance wall 710 may be movably coupled to the memory system 100 or other areas in the enclosure with the memory system 100, meaning the airflow impedance wall 710 may have one or more locations where the airflow impedance wall 710 is coupled and the airflow impedance wall 710 may move while still remaining coupled. For example, the airflow impedance wall 710 may be coupled to the memory system 100 or other areas in the enclosure with the memory system 100 via a hinge mechanism 730 that allows the airflow impedance wall 710 to move with respect to the memory system 100 about the hinge 730. In one example, as shown, the airflow impedance wall 710 may be rotatable about the hinge 730, and moved from the position shown to cool the memory system 100, where the memory system 100 is inaccessible, to a position where the airflow impedance wall 710 is substantially perpendicular to the memory system 100 and the memory system 100 is accessible.

Figure 7A:
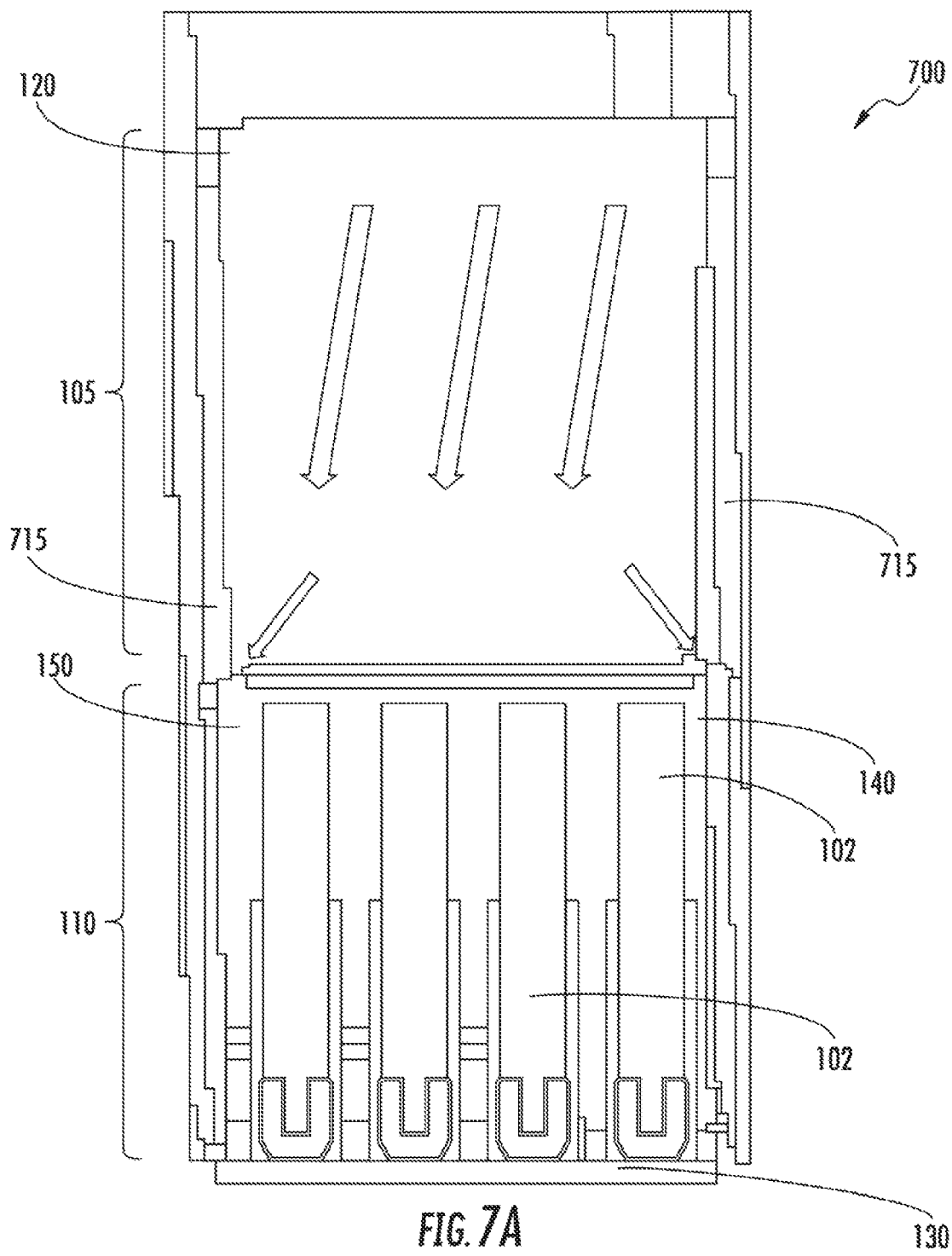
FIG. 7A is an illustration of a top view of an example cooling system for the memory system of FIG. 1, according to certain embodiments.

In one embodiment, as shown with respect to FIG. 7A, the airflow impedance side walls 715 are substantially parallel to the sides of the memory system 100, with a face of each of the airflow impedance side walls 715 facing the sides of the memory system 100 and each other. Further, the distance between the airflow impedance side walls 715 and the memory modules 102 of the first bank 105 and the second bank 110 is substantially uniform (e.g., equal). In such embodiments, as shown, the airflow path may move to the sides from the first bank 105 to the second bank 110, therefore reducing the amount of air moving through the middle section of the second bank 110. The airflow impedance side walls 715 therefore define a width of an angled cavity to be substantially the width of the memory system 100.

Figure 7B:
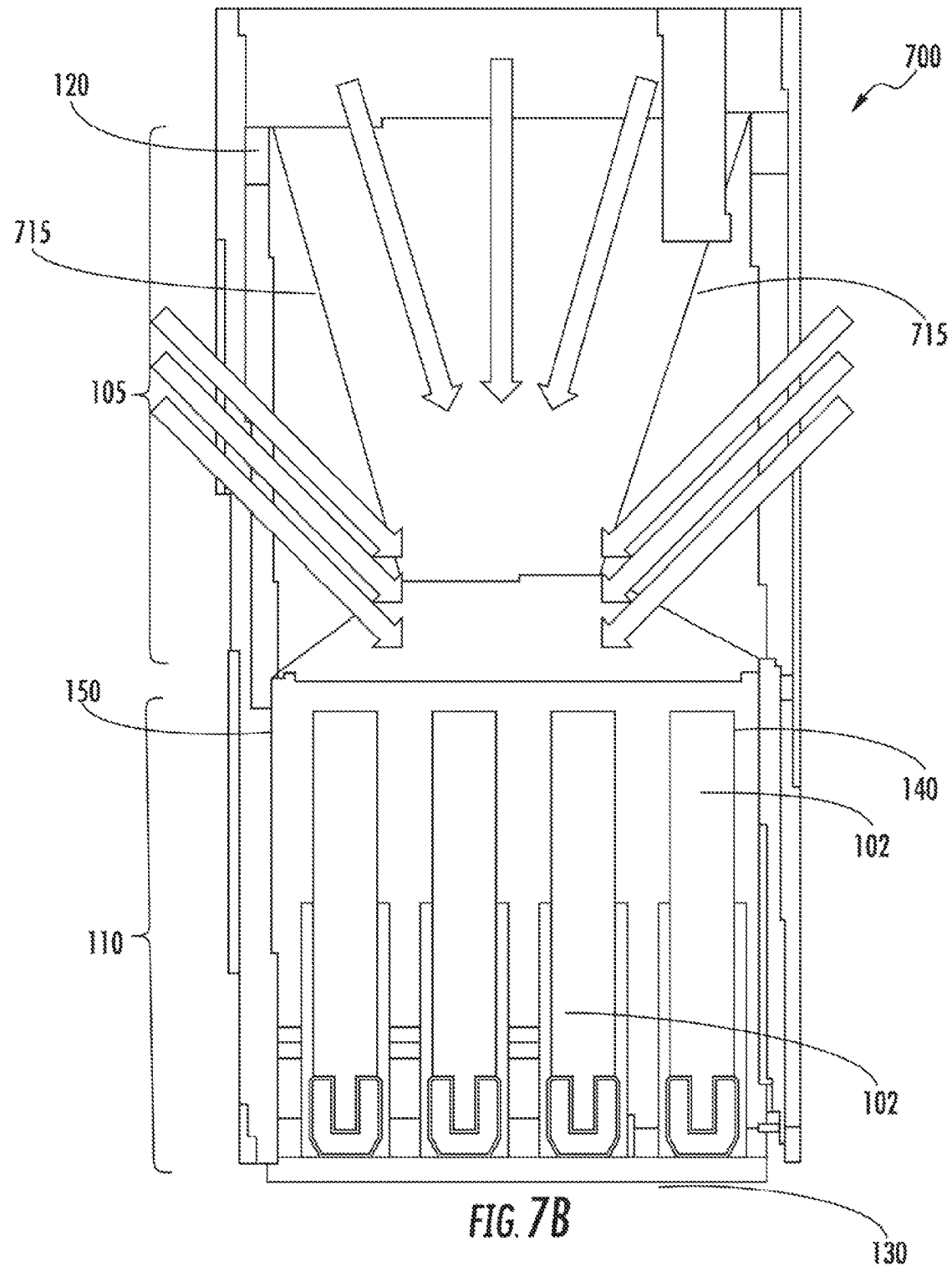
FIG. 7B is an illustration of a top view of an example cooling system for the memory system of FIG. 1, according to certain embodiments.
Figure 8D:
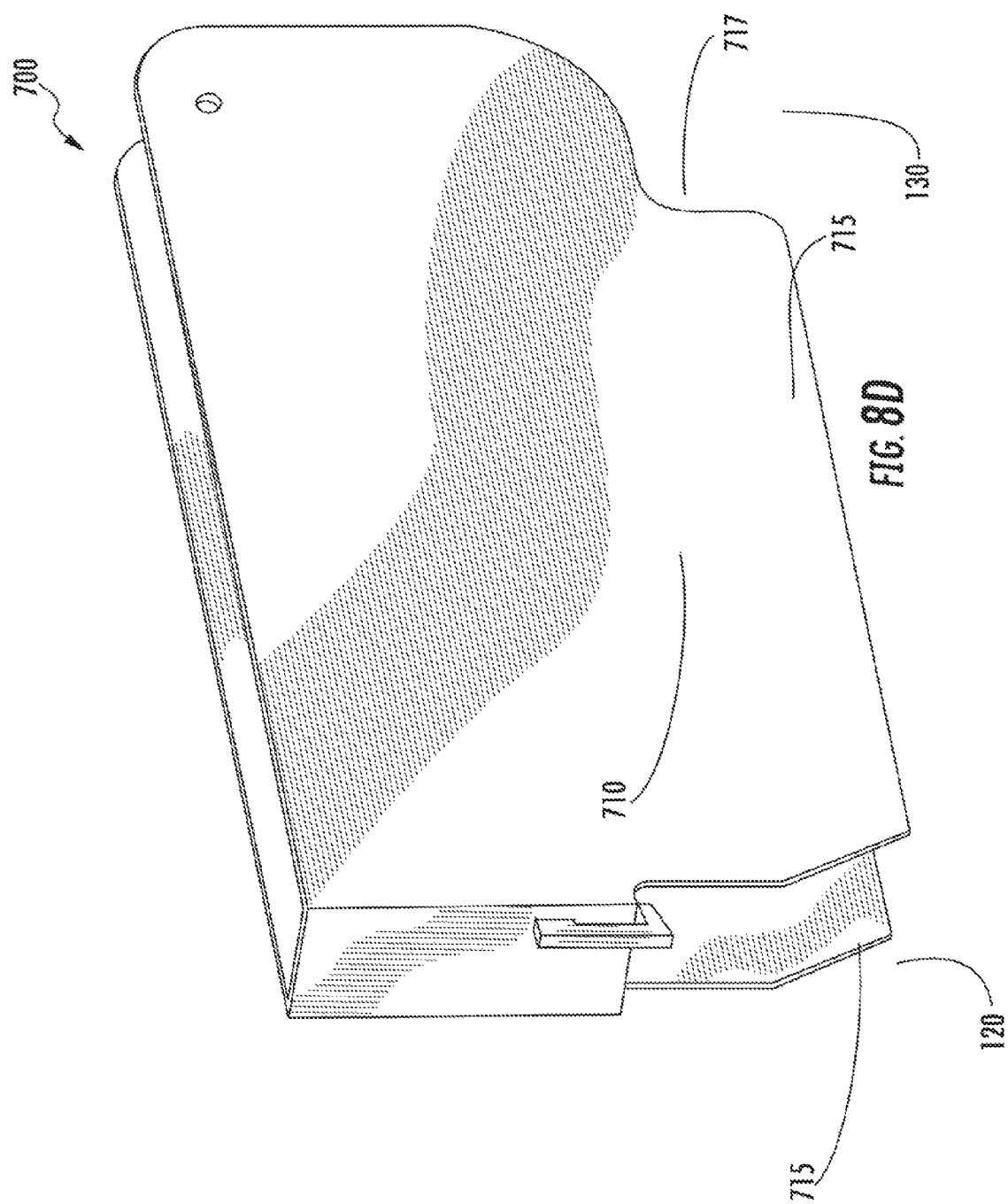
FIG. 8D is an illustration of an isometric view of an example cooling system for the memory system of FIG. 1, according to certain embodiments.

Accordingly, in other embodiments, as shown with respect to FIG. 7B, at least a portion of the airflow impedance side walls 715 are positioned at an angle with respect to the sides of the memory system 100. The angle may be, for example, less than 45 degrees. In particular, the airflow impedance side walls 715 may be configured to taper toward the memory system 100 from the front end 120 to the back end 130. Accordingly, the distance between the airflow impedance side walls 715 and the first bank 105 is generally greater than a distance between the airflow impedance side walls 715 and the second bank 110. Therefore, the distance between the airflow impedance side walls 715 and the memory system 100 may be generally decreasing from the front end 120 to the back end 130. The airflow impedance side walls 715 therefore define a width of an angled cavity to be generally decreasing from a front end of the angled cavity (e.g., the front end 120) to a back end of the angled cavity (e.g., the back end 130). In some embodiments, the airflow impedance side walls 715 may taper substantially all the way from the front end 120 to the back end 130. In such embodiments, the airflow impedance side walls 715 may define an airflow path with increasing airflow impedance from the front end 120 to the back end 130. Therefore, as can be seen by the arrows, the airflow impedance side walls 715 move airflow to the center of the first bank 105 and the second bank 110, to improve cooling efficiency and airflow through the first bank 105 and the second bank 110.

FIGS. 8A-8D illustrate various views of example embodiments of the cooling system 700. As shown in the embodiments of FIGS. 8A-8D, the airflow impedance side walls 715 and the airflow impedance wall 710 are formed as a single contiguous piece. Further, as shown in the embodiments of FIGS. 8A-8D, only a portion of the airflow impedance side walls 715 are angled/tapered, and the remaining portion is parallel to the memory modules 102.

The various walls of the cooling systems described herein may be made of any suitable material, such as various plastics, metals, ceramics, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements described herein, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages described herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s). The present invention may be a system or method.

Aspects of the present invention are described herein with reference to flowchart illustrations and/or block diagrams of methods and apparatus (systems) according to embodiments of the invention.

While the foregoing is directed to embodiments of the present invention, other and further embodiments of the invention may be devised without departing from the basic scope thereof, and the scope thereof is determined by the claims that follow.

What is claimed is:

1. A cooling system for a plurality of arrayed components, arranged in a first bank and a second bank, the first bank being disposed upstream of the second bank along an airflow path, the system comprising:
   a first wall configured to be positioned above the first bank and the second bank, wherein the first wall defines an angled cavity such that a height for the angled cavity generally decreases from a front end to a back end of the angled cavity, and wherein the first wall defines the angled cavity such that a distance between the first wall and the first bank is greater than a distance between the first wall and the second bank;
   a second wall configured to be positioned along a first side of the first bank and the second bank; and
   a third wall configured to be positioned along a second side of the first bank and the second bank opposite the first side, wherein the first wall is positioned at an angle along a height of the second wall and the third wall, wherein the second wall and the third wall define the angled cavity such that a width of the angled cavity generally decreases from the front end to the back end of the angled cavity, wherein the angled cavity is configured to direct air toward the first bank and the second bank, wherein the first wall forms a top portion of the airflow path, the second wall forms a first side portion of the airflow path, and the third wall forms a second side portion of the airflow path.

2. The system of claim 1, wherein the second wall comprises a first opening at a position on the second wall near the back end of the angled cavity.

3. The system of claim 2, wherein the third wall comprises a second opening at a position on the third wall near the back end of the angled cavity.

4. The system of claim 3, wherein at least a portion of the airflow is configured to escape the cooling system via the first opening and the second opening.

5. The system of claim 1, wherein the first wall defines the angled cavity such that the height of the angled cavity decreases from the front end of the angled cavity to a region between the front end and the back end of the angled cavity, and increases from the region to the back end of the angled cavity.

6. The system of claim 5, wherein the increase of the height of the angled cavity from the region to the back end reduces a pressure impedance on airflow from the region to the back end of the angled cavity as compared to the front end to the region of the angled cavity.

7. The system of claim 1, further comprising a coupling component configured to removably couple the system to the plurality of arrayed components.

8. The system of claim 7, wherein the coupling component comprises on or more clips.

9. The system of claim 1, wherein each of the first wall, second wall, and third wall are contiguous.

10. The system of claim 1, wherein the first wall, second wall, and third wall are formed as a single piece.

11. The system of claim 1, wherein the plurality of arrayed components comprises a plurality of memory modules.

12. A cooling system for a plurality of arrayed components arranged in a first bank and a second bank, the first bank being disposed upstream of the second bank along an airflow path, the system comprising:
a first wall configured to be positioned above the first bank and the second bank, wherein the first wall defines an angled cavity such that a height of the angled cavity decreases from a front end of the angled cavity to a region between the front end and a back end of the angled cavity, and increases from the region to the back end of the angled cavity, and wherein the first wall defines the angled cavity such that a distance between the first wall and the first bank is greater than a distance between the first wall and the second bank, wherein the first wall forms a top portion of the airflow path.

13. The system of claim 12, wherein the increase of the height of the angled cavity from the region to the back end reduces a pressure impedance on airflow from the region to the back end of the angled cavity as compared to the front end to the region of the angled cavity.

14. The system of claim 12, further comprising a coupling component configured to movably couple the system to the plurality of arrayed components.

15. The system of claim 14, wherein the coupling component comprises a hinge allowing the first wall to move about an axis with respect to the plurality of arrayed components.

16. The system of claim 12, wherein the plurality of arrayed components comprises a plurality of memory modules.

17. A cooling system for a plurality of arrayed components, arranged in a first bank and a second bank, the first bank being disposed upstream of the second bank along an airflow path, the system comprising:
a first wall configured to be positioned above the first bank and the second bank, wherein the first wall defines an angled cavity such that a height of the angled cavity decreases from a front end of the angled cavity to a region between the front end and a back end of the angled cavity, and increases from the region to the back end of the angled cavity, and wherein the first wall defines the angled cavity such that a distance between the first wall and the first bank is greater than a distance between the first wall and the second bank;
a second wall configured to be positioned along a first side of the first bank and the second bank; and
a third wall configured to be positioned along a second side of the first bank and the second bank opposite the first side, wherein the first wall is positioned at an angle along a height of the second wall and the third wall, wherein the second wall and the third wall define the angled cavity such that a width of the angled cavity generally decreases from the front end to the back end of the angled cavity, and wherein the angled cavity is configured to direct air toward the first bank and the second bank, wherein the second wall comprises a first opening at a position on the second wall near the back end of the angled cavity, and wherein the third wall comprises a second opening at a position on the third wall near the back end of the angled cavity, wherein the first wall forms a top portion of the airflow path, the second wall forms a first side portion of the airflow path, and the third wall forms a second side portion of the airflow path.

18. The system of claim 17, further comprising a coupling component configured to removably couple the system to the plurality of arrayed components.

19. The system of claim 18, wherein the coupling component comprises on or more clips.

20. The system of claim 17, wherein the plurality of arrayed components comprises a plurality of memory modules.

* * * * *